US010203244B2

(12) United States Patent
Tateishi et al.

(10) Patent No.: US 10,203,244 B2
(45) Date of Patent: Feb. 12, 2019

(54) LIGHT DETECTION DEVICE AND ELECTRONIC APPARATUS

(71) Applicant: ROHM CO., LTD., Kyoto (JP)

(72) Inventors: Gota Tateishi, Kyoto (JP); Norikazu Okuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/663,247

(22) Filed: Jul. 28, 2017

(65) Prior Publication Data

US 2018/0038732 A1 Feb. 8, 2018

(30) Foreign Application Priority Data

Aug. 8, 2016 (JP) ................. 2016-155772

(51) Int. Cl.
*G01J 1/42* (2006.01)
*G01J 1/44* (2006.01)
(Continued)

(52) U.S. Cl.
CPC ............... *G01J 1/4228* (2013.01); *G01J 1/44* (2013.01); *G01J 3/0259* (2013.01); *G01J 3/36* (2013.01); *G01J 3/50* (2013.01); *G01J 3/513* (2013.01); *G02B 5/201* (2013.01); *G02B 5/208* (2013.01); *H01L 27/14621* (2013.01); *H01L 27/14645* (2013.01); *H01L 31/00* (2013.01); *H01L 31/0203* (2013.01); *H01L 31/028* (2013.01); *H01L 31/02019* (2013.01); (Continued)

(58) Field of Classification Search
CPC ...... G01J 1/4228; G01J 1/44; G01J 2001/444; G01J 2001/446; G01J 2003/1213; G01J 2003/2806; G01J 2003/2813; G01J 2003/2826; G01J 2003/516; G01J 3/0259; G01J 3/36; G01J 3/50; G01J 3/513; G02B 5/201; G02B 5/208; H01L 27/14621; H01L 27/14645; H01L 31/00; H01L 31/02019; H01L 31/0203; H01L 31/02162; H01L 31/028; H01L 31/103
See application file for complete search history.

(56) References Cited

U.S. PATENT DOCUMENTS

| 8,274,051 B1 | 9/2012 | Aswell et al. | |
|---|---|---|---|
| 2012/0056073 A1* | 3/2012 | Ahn | H01L 27/14609 250/208.1 |
| 2017/0263662 A1* | 9/2017 | Hsieh | H01L 27/14621 |

FOREIGN PATENT DOCUMENTS

JP 2012-084745 A 4/2012

* cited by examiner

*Primary Examiner* — Mark R Gaworecki
(74) *Attorney, Agent, or Firm* — Rabin & Berdo, P.C.

(57) ABSTRACT

A light detection device includes a semiconductor substrate, a signal detection light receiving portion, and an infrared light receiving portion. First and second color filters cover the signal detection light receiving portion and the infrared light receiving portion, respectively. The first color filter passes therethrough visible light in a first wavelength range as well as infrared light. The second color filter passes therethrough visible light in a second wavelength range as well as infrared light. A third color filter covers the infrared light receiving portion. The third color filter passes therethrough visible light in a third wavelength range different from the second wavelength range as well as infrared light. An infrared cut filter covers the signal detection light receiving portion and has an opening in a region opposite to the infrared light receiving portion.

9 Claims, 10 Drawing Sheets

(51) Int. Cl.
　　*G02B 5/20*　　　　(2006.01)
　　*H01L 31/0203*　　(2014.01)
　　*H01L 31/0216*　　(2014.01)
　　*H01L 31/101*　　　(2006.01)
　　*G01J 3/51*　　　　(2006.01)
　　*G01J 3/36*　　　　(2006.01)
　　*H01L 27/146*　　　(2006.01)
　　*H01L 31/02*　　　(2006.01)
　　*H01L 31/028*　　　(2006.01)
　　*H01L 31/103*　　　(2006.01)
　　*G01J 3/50*　　　　(2006.01)
　　*H01L 31/00*　　　(2006.01)
　　*G01J 3/02*　　　　(2006.01)
　　*G01J 3/12*　　　　(2006.01)
　　*G01J 3/28*　　　　(2006.01)

(52) U.S. Cl.
　　CPC ...... *H01L 31/02162* (2013.01); *H01L 31/103* (2013.01); *G01J 2001/444* (2013.01); *G01J 2001/446* (2013.01); *G01J 2003/1213* (2013.01); *G01J 2003/2806* (2013.01); *G01J 2003/2813* (2013.01); *G01J 2003/2826* (2013.01); *G01J 2003/516* (2013.01)

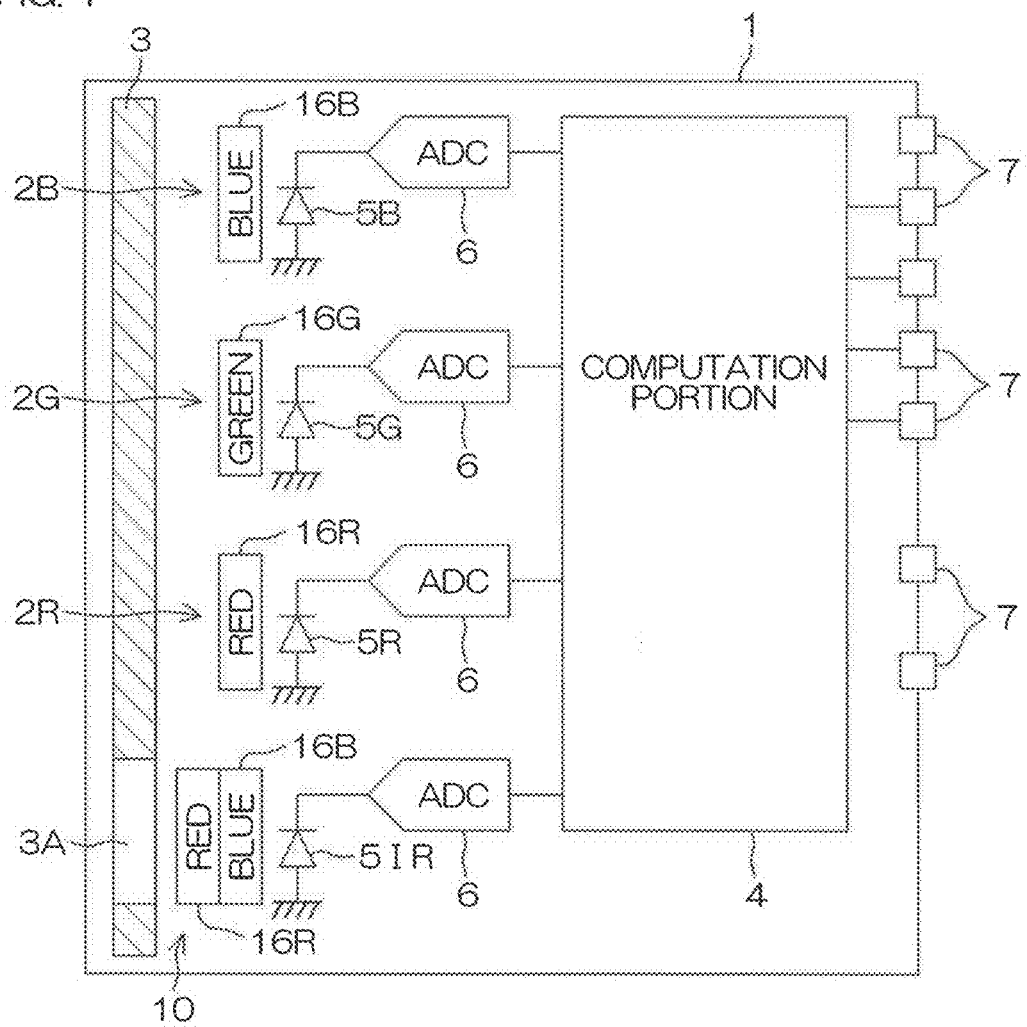

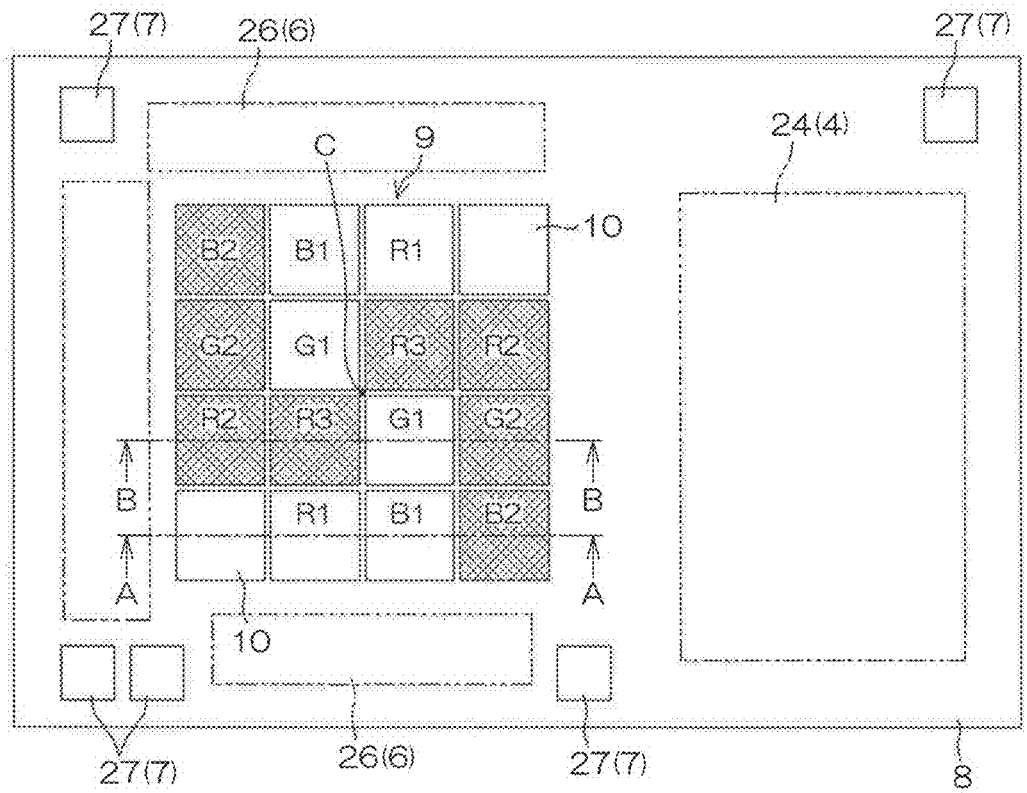
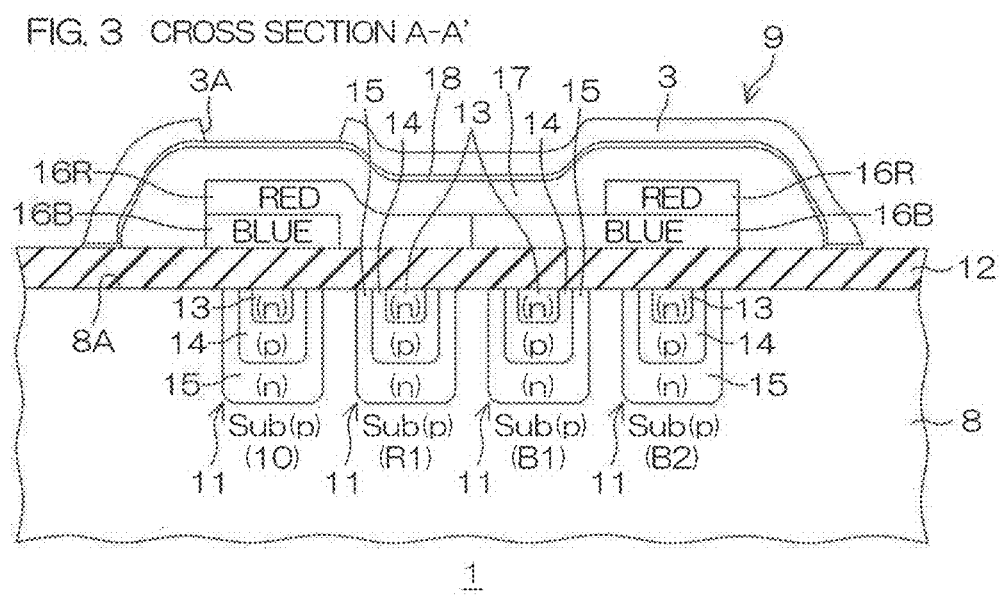

FIG. 4 CROSS SECTION B-B'
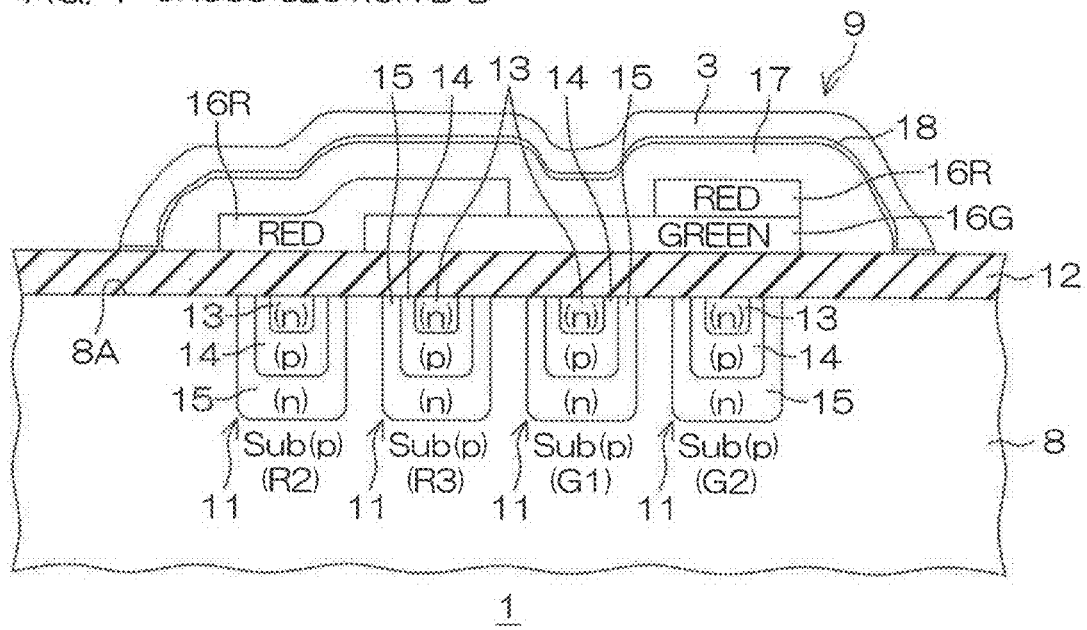
FIG. 5
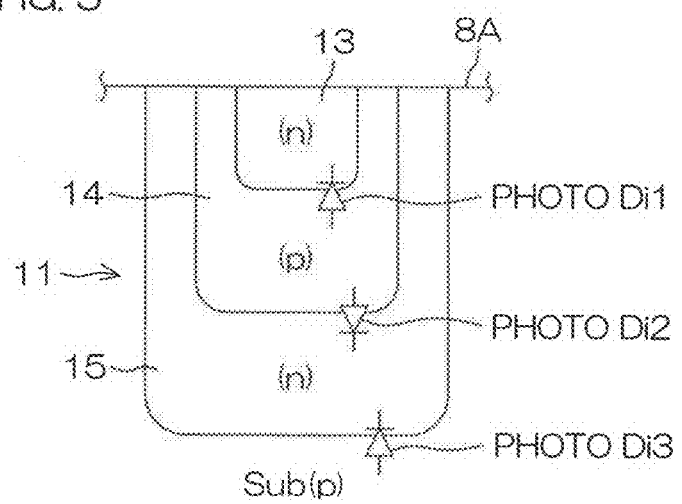

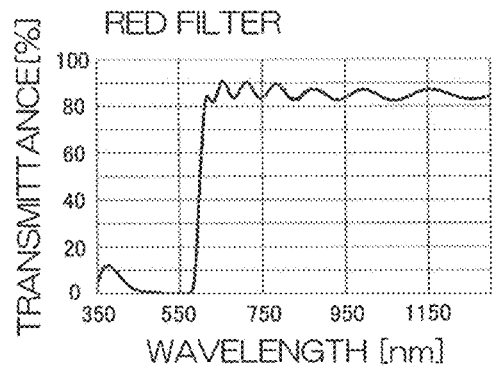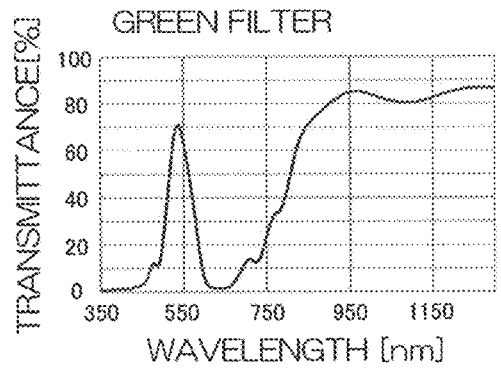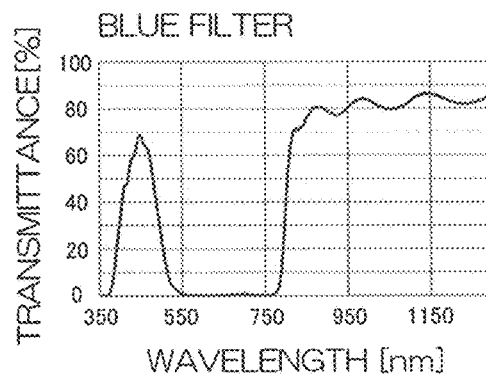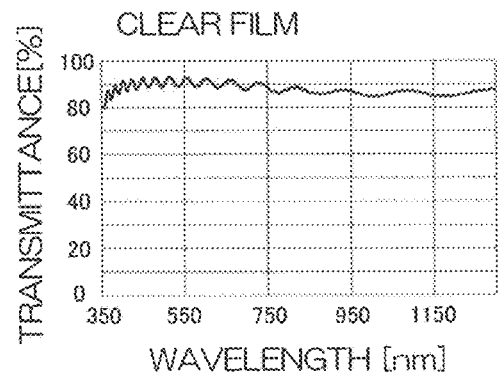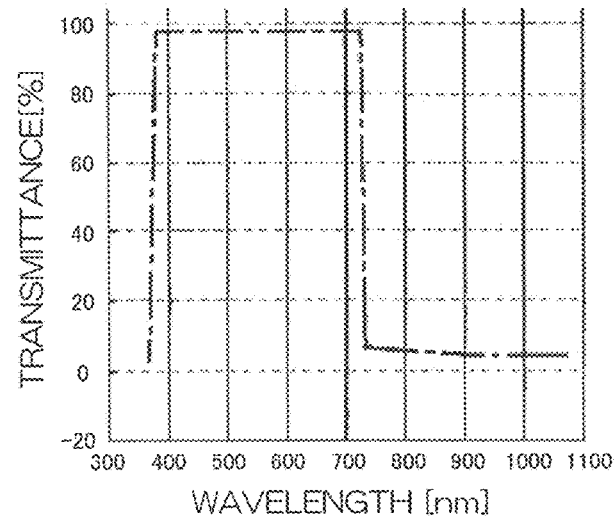

US 10,203,244 B2

LIGHT DETECTION DEVICE AND ELECTRONIC APPARATUS

BACKGROUND OF THE INVENTION

1. Field of the Invention

The present invention relates to a light detection device which includes a color filter and an electronic apparatus which includes the same.

2. Description of the Related Art

Conventionally, in order to separate the infrared light of light incident on a color sensor, an infrared cut filter is used.

For example, the specification of U.S. Pat. No. 8,274,051 discloses an optoelectronic sensor that includes a substrate which has a plurality of sensors, an infrared cut filter which covers the sensors on the substrate and a visible light filter on the infrared cut filter. The infrared cut filter is formed with, for example, a multilayer film in which approximately 50 layers of dielectric films are laminated.

SUMMARY OF THE INVENTION

A preferred embodiment of the present invention provides alight detection device which removes or reduces the influences of infrared light so as to detect a light signal in a visible light wavelength range and which satisfactorily detects an infrared component as well.

A preferred embodiment of the present invention also provides an electronic apparatus that includes a light detection device which removes or reduces the influences of infrared light so as to detect a light signal in a visible light wavelength range and which satisfactorily detects an infrared component as well.

A preferred embodiment of the present invention provides a light detection device which includes a semiconductor substrate, a signal detection light receiving portion that is formed in the semiconductor substrate, an infrared light receiving portion that is formed in the semiconductor substrate, a first color filter that covers the signal detection light receiving portion and that includes a first spectral characteristic such that the first color filter passes therethrough light in a first wavelength range within a wavelength range of visible light and in a wavelength range of infrared light, a second color filter that covers the infrared light receiving portion and that includes a second spectral characteristic such that the second color filter passes therethrough light in a second wavelength range within the wavelength range of visible light and in the wavelength range of infrared light, a third color filter that covers the infrared light receiving portion and that includes a third spectral characteristic such that the third color filter passes therethrough light in a third wavelength range different from the second wavelength range within the wavelength range of visible light and in the wavelength range of infrared light, and an infrared cut filter that covers the signal detection light receiving portion and that includes an opening in a region opposite to the infrared light receiving portion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a block diagram showing the electrical configuration of a light detection device according to a preferred embodiment of the present invention.

FIG. 2 is a layout diagram of the light detection device.

FIG. 3 is a cross-sectional view (cross-sectional view taken along line A-A' in FIG. 2) of the light detection device.

FIG. 4 is a cross-sectional view (cross-sectional view taken along line B-B' in FIG. 2) of the light detection device.

FIG. 5 is an enlarged view of a photodiode in FIGS. 3 and 4.

FIG. 11A shows an example of the spectral characteristics (wavelength versus transmittance) of a red filter, FIG. 11B shows an example of the spectral characteristics (wavelength versus transmittance) of a green filter, FIG. 11C shows an example of the spectral characteristics (wavelength versus transmittance) of a blue filter, FIG. 11D shows an example of the spectral characteristics (wavelength versus transmittance) of a clear film, and FIG. 11E shows an example of the spectral characteristics (wavelength versus transmittance) of the infrared cut filter.

DETAILED DESCRIPTION OF THE PREFERRED EMBODIMENTS

Figure 6:
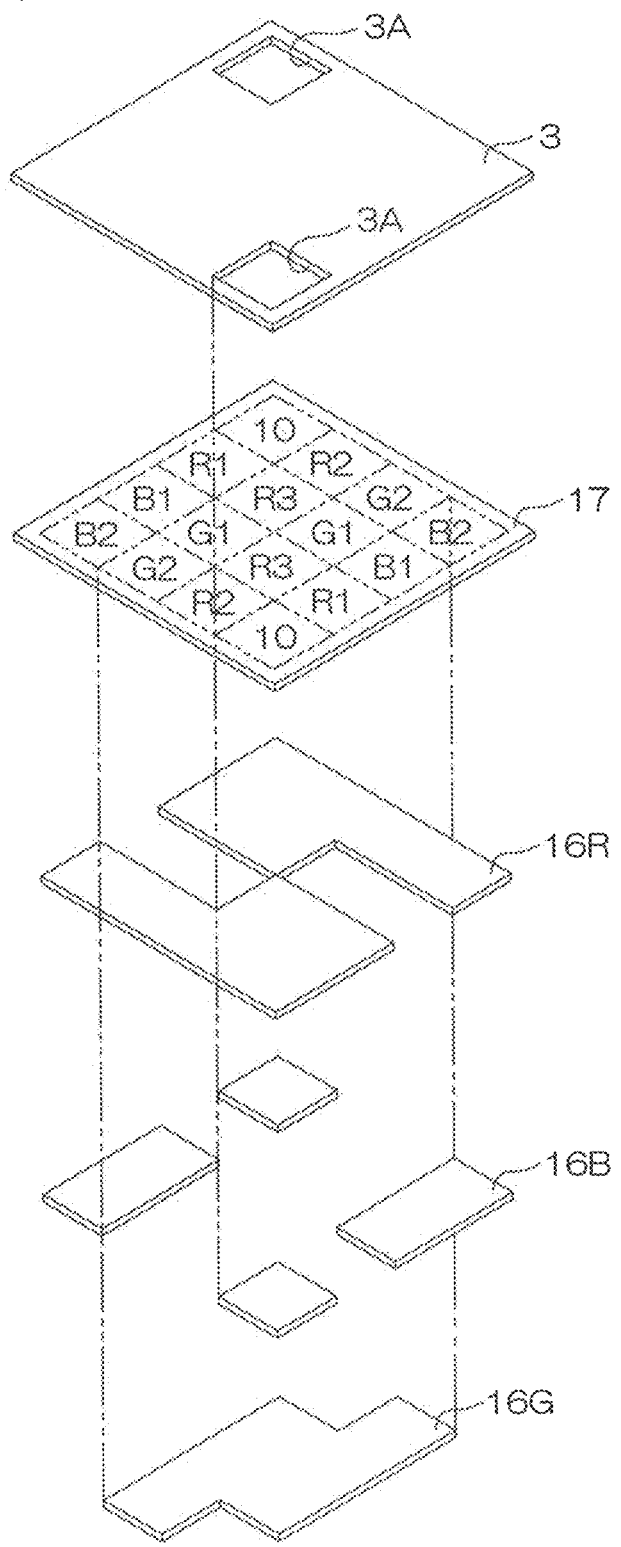
FIG. 6 is an exploded perspective view for illustrating a relationship of the arrangement of a color filter, a clear film and an infrared cut filter.

In a preferred embodiment of the present invention, a light detection device is provided which includes a semiconductor substrate, a signal detection light receiving portion that is formed in the semiconductor substrate, an infrared light receiving portion that is formed in the semiconductor substrate, a first color filter that covers the signal detection light receiving portion and that has a first spectral characteristic such that the first color filter passes therethrough light in a first wavelength range within a wavelength range of visible light and in a wavelength range of infrared light, a second color filter that covers the infrared light receiving portion and that has a second spectral characteristic such that the second color filter passes therethrough light in a second wavelength range within the wavelength range of visible light and in the wavelength range of infrared light, a third color filter that covers the infrared light receiving portion and that has a third spectral characteristic such that the third color filter passes therethrough light in a third wavelength range different from the second wavelength range within the wavelength range of visible light and in the wavelength range of infrared light, and an infrared cut filter that covers the signal detection light receiving portion and that has an opening in a region opposite to the infrared light receiving portion.

In this configuration, since the signal detection light receiving portion is covered with the first color filter and the infrared cut filter, it is possible to preferentially detect light in the first wavelength range while reducing the influences of infrared light. On the other hand, since the infrared light receiving portion is covered with the second and third color filters of the spectral characteristics such that these filters pass therethrough light in the different wavelength ranges within the wavelength range of visible light, light in the second wavelength range which is passed through by the second color filter is attenuated by the third color filter, and light in the third wavelength range which is passed through by the third color filter is attenuated by the second color filter. In this way, it is possible to sufficiently attenuate light in the wavelength range of visible light. In the region corresponding to the infrared light receiving portion, the opening is formed in the infrared cut filter, and thus the infrared light receiving portion can detect light in the infrared light wavelength range (the wavelength range of infrared light) preferentially and highly sensitively. Hence, it is possible to provide the light detection device which can disperse and detect light in the wavelength range of visible light and which can detect infrared light with high sensitivity.

The first wavelength range may be substantially the same as the third wavelength range. In other words, the first spectral characteristic may be substantially the same as the third spectral characteristic. The second wavelength range is preferably a wavelength range which is different from both the first wavelength range and the third wavelength range.

In a preferred embodiment of the present invention, the first color filter includes a blue filter, a green filter or a red filter, the second color filter includes the red filter, and the third color filter includes a blue filter or a green filter.

In this configuration, the signal detection light receiving portion can disperse and detect light in the wavelength range of blue, green or red. On the other hand, the infrared light receiving portion is covered with the red filter, the blue filter or the green filter.

The spectral sensitivity curve of light passing through the blue filter or the green filter has peaks independent of each other in the wavelength range of blue or green and in the wavelength range of infrared light. The spectral sensitivity curve of light passing through the red filter has a transmission wavelength range continuous from the wavelength range of red to the wavelength range of infrared light. Hence, the blue filter or the green filter and the red filter cover the infrared light receiving portion, and thus light in the wavelength range of visible light toward the infrared light receiving portion can be sufficiently attenuated, with the result that the infrared light receiving portion can selectively receive infrared light.

In a preferred embodiment of the present invention, the light detection device further includes a clear filter that covers the signal detection light receiving portion and the infrared light receiving portion from above the first color filter, the second color filter and the third color filter, and the infrared cut filter is formed above the clear filter.

The clear filter is a transparent filter which passes through light in the wavelength range of visible light and in the wavelength range of infrared light. The clear filter is preferably formed so as to absorb and level steps caused by the color filters. The infrared cut filter is formed on such a clear film, and thus it is possible to form the uniform infrared cut filter free from defects.

In a preferred embodiment of the present invention, a transparent protective film is formed on the surface of the clear filter, and the infrared cut filter is formed on the transparent protective film.

In a preferred embodiment of the present invention, the light detection device further includes a correction light receiving portion that is formed in the semiconductor substrate and that corrects an output signal of the signal detection light receiving portion, a fourth color filter that covers the correction light receiving portion and that has a fourth spectral characteristic such that the fourth color filter passes therethrough light in a fourth wavelength range different from the first wavelength range within the wavelength range of visible light and in the wavelength range of infrared light, and a computation portion that is electrically connected to the signal detection light receiving portion and the correction light receiving portion. The first color filter further covers the correction light receiving portion. The computation portion selectively removes or reduces, based on an output signal of the infrared light receiving portion, a wavelength component of infrared light from the output signal of the signal detection light receiving portion.

In this configuration, the signal detection light receiving portion and the correction light receiving portion are covered in common with the first color filter, and only the correction light receiving portion is selectively covered with the fourth color filter. In this way, when the same light enters the signal detection light receiving portion and the correction light receiving portion, in the signal detection light receiving portion, visible light in a predetermined wavelength range and infrared light (infrared light after being attenuated with the infrared cut filter) are detected whereas in the correction light receiving portion, light in substantially all the wavelength ranges of visible light is attenuated with the first color filter and the fourth color filter, and thus it is possible to selectively detect only the same level of infrared light as the infrared light detected in the signal detection light receiving portion. Hence, with a logic circuit, etc., included inside or outside the light detection device, an infrared component in the output signal of the signal detection light receiving portion is selectively removed or reduced based on the magnitude of the output signal of the correction light receiving portion, with the result that it is possible to obtain an output signal (information) close to the actual visible light component in the incident light. Hence, with the light detection device according to a preferred embodiment of the present invention, it is possible to accurately calculate illuminations and color temperatures with a small margin of error.

In the signal separation processing described above, only a signal in the wavelength range of infrared light can be digitally separated by logic computation, and thus, regardless of the direction of incidence of light, it is possible to obtain the signal in which the infrared component is sufficiently attenuated or removed.

The fourth wavelength range may be substantially the same as the second wavelength range. In other words, the fourth spectral characteristic may be substantially the same as the second spectral characteristic. The fourth color filter may be a red filter.

In a preferred embodiment of the present invention, each of the signal detection light receiving portion and the correction light receiving portion includes a first p-n junction portion that is located at the same depth from the surface of the semiconductor substrate, and a second p-n junction portion that is located in a position deeper than the first p-n junction portion.

The transmission depth of light in the semiconductor substrate is increased as the wavelength is increased. Hence, the p-n junction portion of an appropriate depth is used according to the wavelength of light in a target to be detected, and thus it is possible to efficiently detect light.

In a preferred embodiment of the present invention, the signal detection light receiving portion includes a green signal light receiving portion and a blue signal light receiving portion, the correction light receiving portion includes a green correction light receiving portion and a blue correction light receiving portion, the first color filter includes a green filter that covers the green signal light receiving portion and a blue filter that covers the blue signal light receiving portion, and the fourth color filter includes a red filter that covers the green correction light receiving portion and the blue correction light receiving portion and that covers neither the green signal light receiving portion nor the blue signal light receiving portion.

In this configuration, the green signal light receiving portion is covered with the green filter and the infrared cut filter, and the blue signal light receiving portion is covered with the blue filter and the infrared cut filter. The green correction light receiving portion is covered with the green filter, the red filter and the infrared cut filter, and the blue correction light receiving portion is covered with the blue filter, the red filter and the infrared cut filter. Hence, the green signal light receiving portion can selectively receive light in the wavelength range of green. A small amount of infrared component passing through the infrared cut filter can be reduced or removed with the output of the green correction light receiving portion. Likewise, the blue signal light receiving portion can selectively receive light in the wavelength range of blue. A small amount of infrared component passing through the infrared cut filter can be reduced or removed with use of the output of the blue correction light receiving portion.

Both the second color filter and the fourth color filter may be red filters. In this case, in the manufacturing process of the light detection device, the second and fourth color filters can be formed in the same process.

In a preferred embodiment of the present invention, the first color filter includes a first color resist. The second color filter includes a second color resist. The third color filter includes a third color resist.

In a preferred embodiment of the present invention, the light detection device which has the features described above and an electronic apparatus which includes a housing storing the light detection device described above are provided. In this way, it is possible to provide the electronic apparatus that includes the light detection device which removes or reduces the influences of infrared light so as to detect a light signal in the wavelength range of visible light and which satisfactorily detects an infrared component.

A preferred embodiment of the present invention will be described in detail below with reference to the accompanying drawings.

FIG. 1 is a block diagram showing the electrical configuration of a light detection device 1 according to a preferred embodiment of the present invention.

The light detection device 1 includes a red light receiving portion 2R, a green light receiving portion 2G and a blue light receiving portion 2B, an infrared cut filter 3 which covers the light receiving portions 2R, 2G and 2B, an infrared light receiving portion 10, and a computation portion 4.

The red light receiving portion 2R, the green light receiving portion 2G, the blue light receiving portion 2B and the infrared light receiving portion 10 include photodiodes 5R, 5G, 5B and 5IR, respectively. The photodiodes 5R, 5G, 5B and 5IR each are electrically connected to the computation portion 4. Between the photodiodes 5R, 5G, 5B and 5IR and the computation portion 4, ADCs (analog-digital converters) 6 are interposed. When light enters the p-n junction portion of each of the photodiodes 5R, 5G, 5B and 5IR, a current is generated by a photovoltaic effect, the current is converted from an analog signal into a digital signal in the ADC 6 and the digital signal is input to the computation portion 4. In the computation portion 4, computation processing is performed based on the input signal.

The computation portion 4 is formed with, for example, an integrated circuit such as an LSI (Large Scale Integration), and includes various types of circuit elements or devices such as transistors, capacitors and resistors. The computation portion 4 is electrically connected to a plurality of external electrodes 7 which are formed on the outermost surface of the light detection device 1. Via the plurality of external electrodes 7, signal output from the computation portion 4, power input to the computation portion 4 and the photodiodes 5R, 5G, 5B and 5IR, etc., are performed.

FIG. 2 is a layout diagram of the light detection device 1.

The light detection device 1 includes a semiconductor substrate 8. On the semiconductor substrate 8, a light receiving region 9, functional element regions 26, 24 and electrode pads 27 are provided. In the functional element regions 26, functional elements or devices or devices such as semiconductor elements or devices forming the ADCs 6, etc., are formed. In the functional element region 24, functional elements or devices such as semiconductor elements or devices forming the computation portion 4, etc., are formed. The electrode pads 27 form the external electrodes 7. The functional element regions 26 and 24 are arranged around the light receiving region 9. The electrode pads 27 are arranged in the peripheral edge portion of the semiconductor substrate 8. Although in FIG. 2, reference symbols are omitted for clarity, each of the red light receiving portion 2R, the green light receiving portion 2G and the blue light receiving portion 2B includes a plurality of light receiving portions, and they are arranged in the light receiving region 9.

Specifically, the red light receiving portion 2R includes signal detection light receiving portions R1 (red signal light receiving portions) and correction infrared light receiving portions R2 and R3 (red correction light receiving portions). The green light receiving portion 2G includes signal detection light receiving portions G1 (green signal light receiving portions) and correction infrared light receiving portions G2 (green correction light receiving portions). The blue light receiving portion 2B includes signal detection light receiving portions B1 (blue signal light receiving portions) and correction infrared light receiving portions B2 (blue correction light receiving portions). For each of the signal detection light receiving portions R1, G1, B1 and the correction infrared light receiving portions R2, R3, G2 and B2, a plurality of pieces are provided. Among these light receiving portions, at least a plurality of signal detection light receiving portions R1, G1 and B1 are arranged so as to be located symmetrically with respect to the center C (center of gravity), serving as the center of symmetry, of the light receiving region 9 which is formed in the shape of a quadrangle in a plan view. A plurality of correction infrared light receiving portions R2, R3, G2 and B2 may likewise be arranged so as to be located symmetrically with respect to the center C as shown in FIG. 2. In this way, even when light does not sufficiently enter the signal detection light receiving portions R1, G1 and B1 on one side, for example, because light is not uniformly applied to the entire light receiving region 9 of the semiconductor substrate 8, the signal detection light receiving portions R1, G1 and B1 on the other side can detect the light, with the result that reliability is satisfactorily achieved. For example, even when light insufficiently enters the edge portion of the light receiving region 9 in the lower side of the plane of the sheet, and thus light cannot be satisfactorily detected in the signal detection light receiving portions R1 and B1 on the edge portion, the light can be detected in the signal detection light receiving portions R1 and B1 on the edge portion of the light receiving region 9 in the upper side of the plane of the sheet.

In FIG. 2, the reference symbols of the red light receiving portion 2R, the green light receiving portion 2G and the blue light receiving portion 2B are omitted for clarity, the signal detection light receiving portions R1, G1 and B1 are shown in the shape of a white-solid quadrangle and the correction infrared light receiving portions R2, R3, G2 and B2 are shown in the shape of a hatched quadrangle.

In corner portions of the light receiving region 9 which is formed in the shape of a quadrangle in a plan view, the infrared light receiving portions 10 capable of receiving infrared light are formed. In the preferred embodiment, the infrared light receiving portion 10 is formed at least in each of corner portions forming a pair of opposite corners in the light receiving region 9 in a plan view. The infrared light receiving portion 10 includes the photodiode. While the infrared cut filter 3 is formed so as to cover the red light receiving portion 2R, the green light receiving portion 2G and the blue light receiving portion 2B, the infrared cut filter 3 includes openings 3A in regions corresponding to the infrared light receiving portions 10 so as not to cover the infrared light receiving portions 10.

The cross-sectional structures of the signal detection light receiving portions R1, G1 and B1, the correction infrared light receiving portions R2, R3, G2 and B2 and the infrared light receiving portion 10 will be described with reference to FIGS. 3 to 5.

FIG. 3 is a cross-sectional view (cross-sectional view taken along line A-A' in FIG. 2) of the light detection device 1. FIG. 4 is a cross-sectional view (cross-sectional view taken along line B-B' in FIG. 2) of the light detection device 1. FIG. 5 is an enlarged view of the photodiode in FIGS. 3 and 4.

The signal detection light receiving portions R1, G1 and B1, the correction infrared light receiving portions R2, R3, G2 and B2 and the infrared light receiving portion 10 include, as common elements, the semiconductor substrate 8, photodiodes 11 formed in the semiconductor substrate 8 and an interlayer insulating film 12 which covers the entire surface of the semiconductor substrate 8. Although the photodiodes 11 respectively correspond to the photodiodes 5R, 5G, 5B and 5IR in FIG. 1, the reference symbols of the photodiodes 5R, 5G, 5B and 5IR are omitted in FIGS. 3 to 5 for clarity.

In the preferred embodiment, the semiconductor substrate 8 is formed with a p-type silicon substrate.

The photodiode 11 has an n-p-n-p structure in which a first n-type region 13, a first p-type region 14, a second n-type region 15 and a p-type semiconductor substrate 8 that are formed sequentially from the front surface 8A of the p-type semiconductor substrate 8 are arranged. The second n-type region 15 is formed on the front surface portion of the p-type semiconductor substrate 8, the first p-type region 14 is formed in the inner region of the second n-type region 15, and furthermore the first n-type region 13 is formed in the inner region of the first p-type region 14. In this way, as shown in FIG. 5, the photodiode 11 has a photodiode Di1, a photodiode Di2 and a photodiode Di3 which include p-n junction portions having different depths from the front surface 8A of the semiconductor substrate 8.

The photodiode Di1 includes the p-n junction portion between the first p-type region 14 and the first n-type region 13, and the depth of the p-n junction portion from the front surface 8A is, for example, 0.09 to 0.17 µm. The photodiode Di2 includes the p-n junction portion between the first p-type region 14 and the second n-type region 15, and the depth of the p-n junction portion from the front surface 8A is deeper than the p-n junction portion of the photodiode Di1 and is, for example, 1.0 to 1.8 µm. The photodiode Di3 includes the p-n junction portion between the p-type semiconductor substrate 8 and the second n-type region 15, and the depth of the p-n junction portion from the front surface 8A is deeper than the p-n junction portion of the photodiode Di2 and is, for example, 3.2 to 5.9 µm.

The photodiode 11 having the photodiodes Di1 to Di3 whose depths are different from each other has the following advantages. Specifically, since there is a tendency that in a silicon substrate, as the wavelength of light is increased, its transmission depth is increased, when, as in the light detection device 1, a plurality of wavelength ranges of light components need to be detected, it is possible to efficiently detect light in any one of the photodiodes Di1 to Di3. For example, the photodiode Di1 is suitable for detecting components in the wavelength range of blue (for example, 420 to 480 nm) and in the wavelength range of green (for example, 500 to 560 nm), and the photodiode Di2 is suitable for detecting components in the wavelength range of green and in the wavelength range of red (for example, 590 to 680 nm). The photodiode Di3 is suitable for detecting a component in the wavelength range of infrared light (for example, 700 to 1300 nm).

In the semiconductor substrate 8, in addition to the photodiodes 11, for example, the impurity regions of transistors forming the computation portion 4 may be formed. In this case, the first n-type region 13, the first p-type region 14, the second n-type region 15 may be formed in the same process steps for the impurity regions such as a source region (S), a drain region (D) and an element separation buried layer (L/I, B/L) forming the transistor.

The interlayer insulating film 12 is formed of an insulating material such as silicon oxide ($SiO_2$). The interlayer insulating film 12 may be a single layer as shown in FIGS. 3 and 4 or may be multiple layers.

On the interlayer insulating film 12, a red filter 16R, a green filter 16G and a blue filter 16B are formed, and a clear film 17 is formed so as to cover the filters 16R, 16G and 16B. On the front surface of the clear film 17, a protective film 18 formed with a transparent insulating film such as SiO2 is formed, and the infrared cut filter 3 is formed on the front surface of the protective film 18. The clear film 17 is formed so as to absorb steps formed at the end portions of the color filters 16R, 16G and 16B and thereby level the front surfaces. The infrared cut filter 3 is formed on such a clear film 17, and thus it is possible to form the uniform infrared cut filter free from defects.

The infrared cut filter 3 may be formed with, for example, a multilayer dielectric film in which a plurality of layers (for example, approximately 50 layers) of $SiO_2/TiO_2$ structures are laminated. While the infrared cut filter 3 is a common coating film for all the signal detection light receiving portions R1, G1 and B1 and the correction infrared light receiving portions R2, R3, G2 and B2, the infrared cut filter 3 has the openings 3A in the regions corresponding to the infrared light receiving portions 10. The red filter 16R, the green filter 16G and the blue filter 16B can be formed with, for example, a color resist based on a pigment, a transmission-type resist formed by using a nanoimprint technology, a gelatin film, etc.

FIG. 6 is a schematic exploded perspective view for illustrating a relationship of the arrangement of the color filters 16R, 16G and 16B, the clear film 17 and the infrared cut filter 3. For convenience, on the front surface of the clear film 17, the boundaries of the light receiving portions R1, R2, R3, G1, G2, B1, B2 and 10 are indicated by phantom lines.

Although whether or not the red filter 16R, the green filter 16G and the blue filter 16B are provided is determined depending on the type of the light receiving portion below them, the color filter of the common color have to be provided for the light receiving portions for detecting the same color. Specifically, for the signal detection light receiving portions R1 and the correction infrared light receiving portions R2 and R3 for red, the red filter 16R is provided. Likewise, for the signal detection light receiving portions G1 and the correction infrared light receiving portions G2 for green, the green filter 16G is provided. For the signal detection light receiving portions B1 and the correction infrared light receiving portions B2 for blue, the blue filter 16B is provided. For the infrared light receiving portions 10, the red filter 16R and the blue filter 16 are arranged so as to be laminated.

The arrangement of the color filters 16R, 16G and 16B will be more specifically described. For the signal detection light receiving portions R1, a single-layer film of the red filter 16R is provided. For the correction infrared light receiving portions R2, a single-layer film of the red filter 16R is provided. For the correction infrared light receiving portions R3, a laminated film of the red filter 16R and the green filter 16G (16R on the upper side) is provided. For the signal detection light receiving portions G1, a single-layer film of the green filter 16G is provided. For the correction infrared light receiving portions G2, a laminated film of the red filter 16R and the green filter 16G (16R on the upper side) is provided. Furthermore, for the signal detection light receiving portions B1, a single-layer film of the blue filter 16B is provided. For the correction infrared light receiving portions B2, a laminated film of the red filter 16R and the blue filter 16B (16R on the upper side) is provided.

The clear film 17 is arranged so as to cover all the light receiving portions, that is, the red, green and blue light receiving portions 2R, 2G and 2B and the infrared light receiving portions 10. The clear film 17 is arranged on the color filters 16R, 16G and 16B so as to cover the color filters 16R, 16G and 16B.

The entire surface of the clear film 17 is covered by the protective film 18 (see FIGS. 3 and 4). On the protective film 18, the infrared cut filter 3 is arranged. While the infrared cut filter 3 is arranged so as to cover the red, green and blue light receiving portions 2R, 2G and 2B, the infrared cut filter 3 has the openings 3A in the regions corresponding to the infrared light receiving portions 10 so as not to cover the infrared light receiving portions 10.

The spectral sensitivity characteristics of the red light receiving portion 2R, the green light receiving portion 2G and the blue light receiving portion 2B obtained by the computation of the separation of infrared light will then be individually described.

(1) Blue Characteristics

Figure 7:
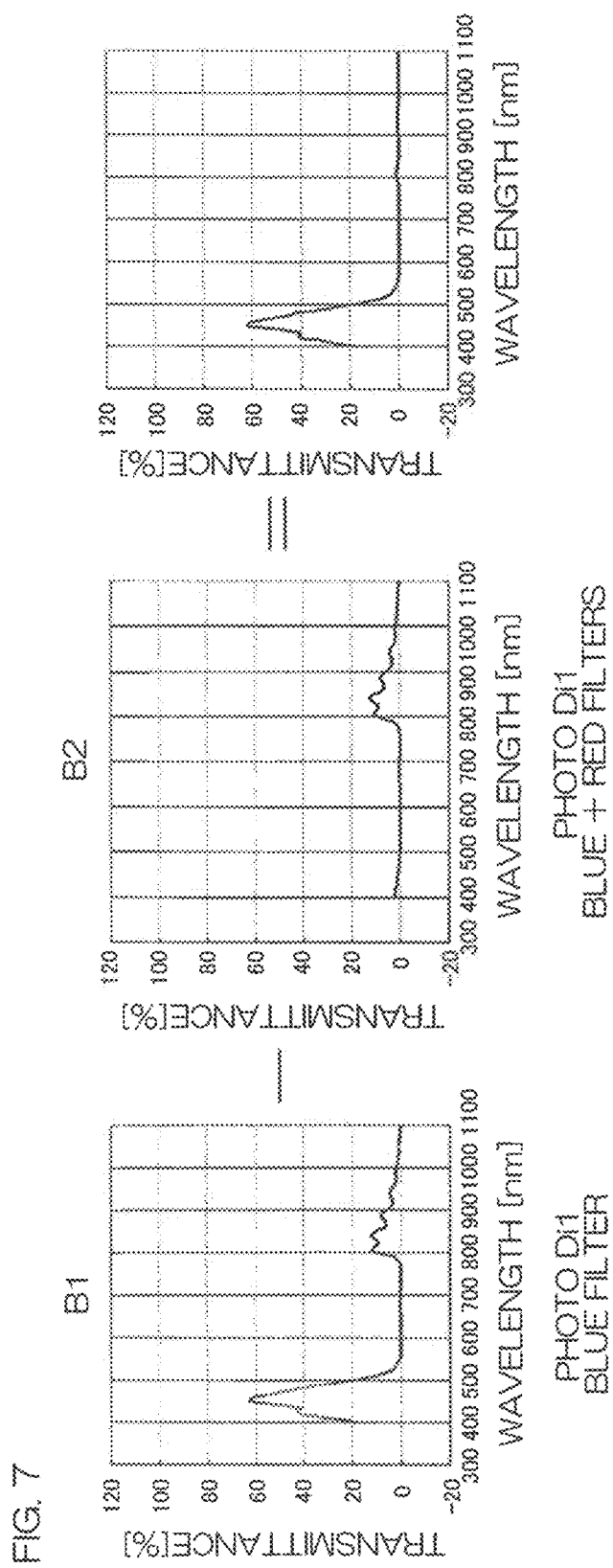
FIG. 7 is a diagram for illustrating the computation of the separation of infrared light in a blue light receiving portion.

With respect to the blue light receiving portion 2B, when light enters the signal detection light receiving portion B1 and the correction infrared light receiving portion B2, in the photodiode Di1 of the signal detection light receiving portion B1, blue light and a small amount of infrared light passing through the infrared cut filter 3 are detected. On the other hand, in the photodiode Di1 of the correction infrared light receiving portion B2, the blue light is selectively blocked by the red filter 16R, and only the same level of infrared light as the infrared light detected in the signal detection light receiving portion B1 is detected. When the spectral sensitivity characteristics here are represented by a curve, the leftmost curved line and the center curved line of FIG. 7 are provided. A signal whose magnitude corresponds to the detection of the blue light and the small amount of infrared light passing through the infrared cut filter 3 is input to the computation portion 4 from the signal detection light receiving portion B1, and a signal whose magnitude corresponds to the detection of the infrared light is input to the computation portion 4 from the correction infrared light receiving portion B2. Then, a portion in the wavelength range of infrared light is selectively removed or reduced based on the output signal of the correction infrared light receiving portion B2 (B1−B2), and thus it is possible to obtain an output signal (information) close to the actual light component of blue in the incident light. When the spectral sensitivity characteristics obtained by the signal separation processing are represented by a curve, the rightmost curved line of FIG. 7 is provided.

As is clear from FIG. 7, the spectral sensitivity curve of the light passing through the single-layer film of the blue filter 16B in the signal detection light receiving portion B1 has peaks independent of each other in the wavelength range of blue and in the wavelength range of infrared light. Hence, a curve which has the peak in the wavelength range of blue and which is formed in the shape of a mountain is separated from the spectral sensitivity curve where these peaks appear, and thus a curve which can be considered to be derived from infrared light and which is formed in the shape of a mountain is clearly left. In other words, in the preferred embodiment, the light in the wavelength range of blue is separated by the red filter 16R in the correction infrared light receiving portion B2, and thus it is possible to simply distinguish infrared light as indicated by the spectral sensitivity curve of the correction infrared light receiving portion B2 in FIG. 7.

(2) Green Characteristics

Figure 8:
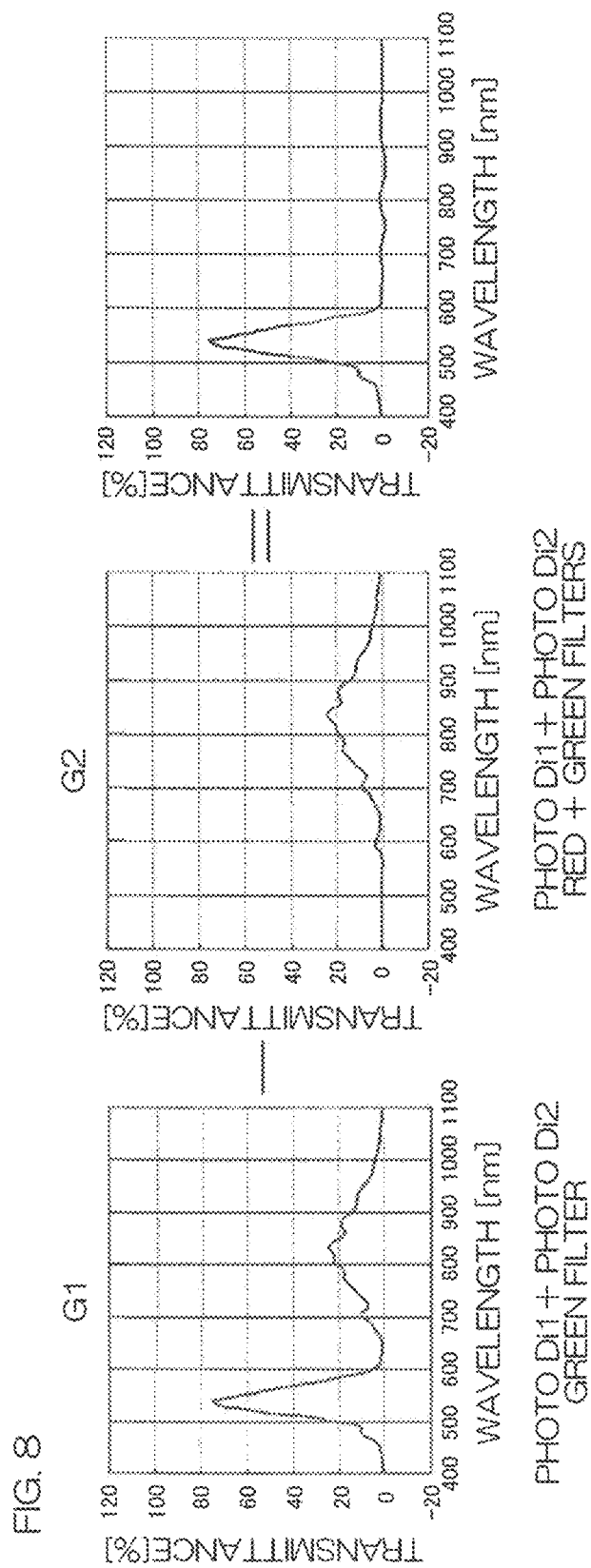
FIG. 8 is a diagram for illustrating the computation of the separation of infrared light in a green light receiving portion.

With respect to the green light receiving portion 2G, first, when light enters the signal detection light receiving portions G1 and the correction infrared light receiving portions G2, in the photodiode Di1 and the photodiode Di2 of the signal detection light receiving portions G1, green light and a small amount of infrared light passing through the infrared cut filter 3 are detected. On the other hand, in the photodiode Di1 and the photodiode Di2 of the correction infrared light receiving portions G2, the green light is selectively blocked by the red filter 16R, and only the same level of infrared light as the infrared light detected in the signal detection light receiving portions G1 is detected. When the spectral sensitivity characteristics here are represented by a curve, the leftmost curved line and the center curved line of FIG. 8 are provided. A signal whose magnitude corresponds to the detection of the green light and the infrared light is input to the computation portion 4 from the signal detection light receiving portions G1, and a signal whose magnitude corresponds to the detection of the infrared light is input to the computation portion 4 from the correction infrared light receiving portions G2. Then, a portion in the wavelength range of infrared light is selectively removed or reduced based on the magnitude of the output signal of the signal detection light receiving portions G1 (G1−G2), and thus it is possible to obtain an output signal (information) close to the actual light component of green in the incident light. When the spectral sensitivity characteristics obtained by the signal separation processing are represented by a curve, the rightmost curved line of FIG. 8 is provided.

As is clear from FIG. 8, the spectral sensitivity curve of the light passing through the single-layer film of the green filter 16G in the signal detection light receiving portions G1 has peaks independent of each other in the wavelength range of green and in the wavelength range of infrared light. Hence, a curve which has the peak in the wavelength range of green and which is formed in the shape of a mountain is separated from the spectral sensitivity curve where these peaks appear, and thus a curve which can be considered to be derived from infrared light and which is formed in the shape of a mountain is clearly left. In other words, in the preferred embodiment, the light in the wavelength range of green is separated by the red filter 16R in the correction infrared light receiving portions G2, and thus it is possible to simply distinguish infrared light as indicated by the spectral sensitivity curve of the correction infrared light receiving portions G2 in FIG. 8.

(3) Red Characteristics

On the other hand, with respect to the red light receiving portion 2R, unlike the cases of the blue light receiving portion 2B and the green light receiving portion 2G described above, as shown in the leftmost of FIG. 9, the spectral sensitivity curve of the light passing through the single-layer film of the red filter 16R in the signal detection light receiving portion R1 and the infrared cut filter 3 does not necessarily have clearly independent peaks in the wavelength range of red and in the wavelength range of infrared light, respectively. Hence, even by the method of simply separating red light with the blue filter 16B and the green filter 16G in the infrared light receiving portions R2 and R3, it is difficult to selectively distinguish infrared light. Thus, in the preferred embodiment, the relationship is utilized in which as the wavelength of light is increased, its transmission depth is increased in the semiconductor substrate 8.

Figure 9:
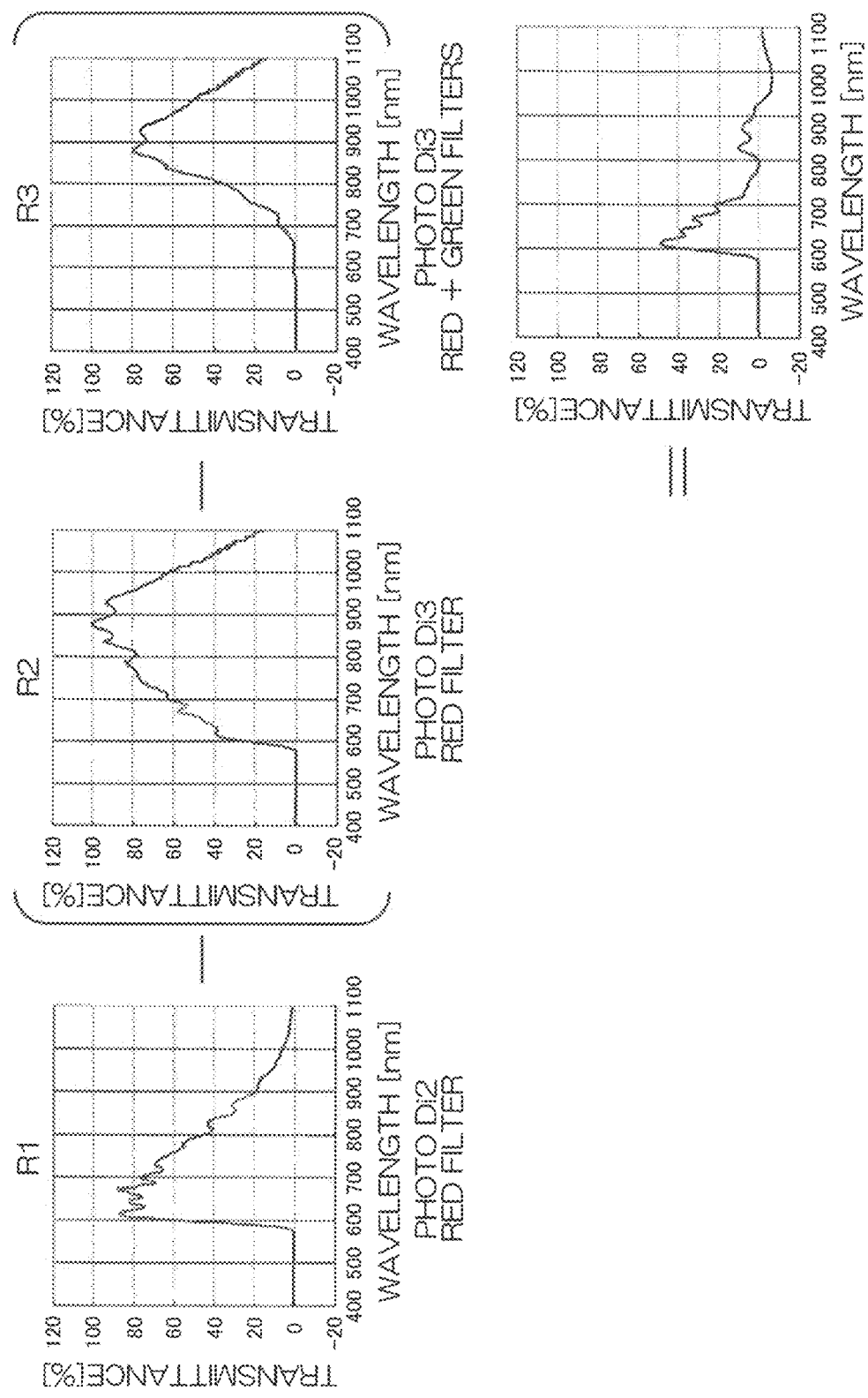
FIG. 9 is a diagram for illustrating the computation of the separation of infrared light in a red light receiving portion.

Specifically, as shown in FIG. 9, in the signal detection light receiving portion R1, red light is mainly detected in the photodiode Di2 which is formed in a relatively shallow position. By performing the detection with the photodiode Di2, it is possible to satisfactorily detect red light whose wavelength is shorter than that of infrared light.

On the other hand, with the correction infrared light receiving portions R2 and R3, spectral characteristics close to the infrared band of the signal detection light receiving portion R1 are produced. Specifically, red light and infrared light are detected by the photodiode Di3 of the correction infrared light receiving portion R2. On the other hand, in the photodiode Di3 of the correction infrared light receiving portion R3, red light is selectively blocked by the green filter 16G, and only the same level of infrared light as the infrared light detected in the signal detection light receiving portion R1 is detected. The detection of the same level of infrared light as the infrared light in the signal detection light receiving portion R1 can be attained by slightly (approximately 10 to 20%) decreasing the area of the correction infrared light receiving portion R3 as compared with the infrared light receiving portion R2 and changing the material of the color filter. Then, a portion in the wavelength range of infrared light is selectively removed or reduced from the output signal of the signal detection light receiving portion R1 based on information obtained by a combination of the correction infrared light receiving portions R2 and R3 (R1−(R2−R3)), and thus it is possible to obtain an output signal (information) close to the actual light component of red in the incident light. When the spectral sensitivity characteristics obtained by the signal separation processing are represented by a curve, the curved line at the lower stage of FIG. 9 is provided.

Figure 10:
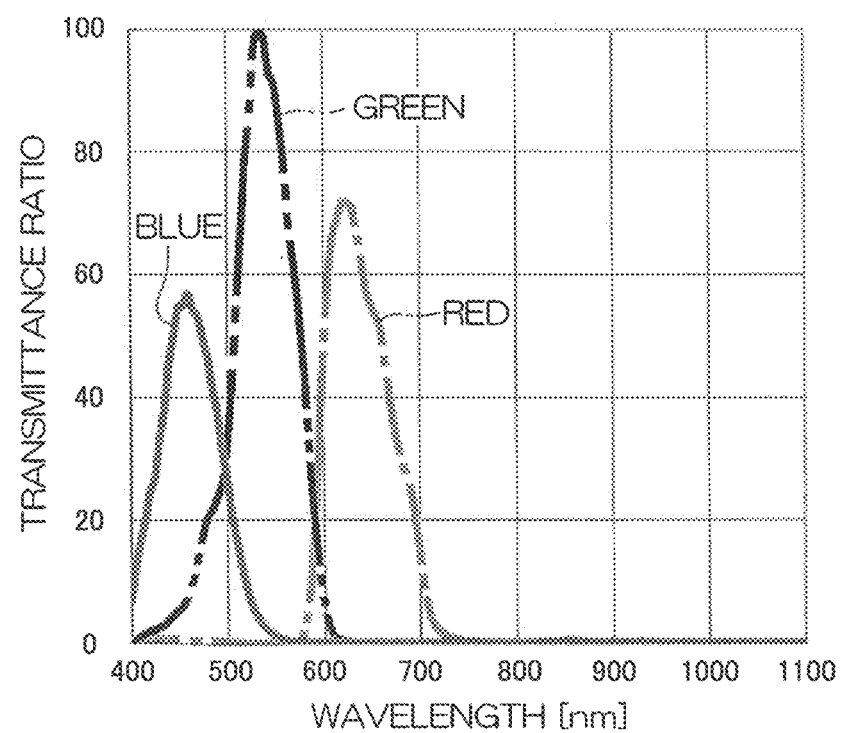
FIG. 10 is a diagram showing the final spectral sensitivity characteristics of the light detection device.

Hence, by the computation processing described above, the sensitivity in the wavelength range of infrared light in the light receiving portions 2R, 2G and 2B is reduced, and thus it is possible to obtain spectral sensitivity characteristics shown in FIG. 10 as the spectral sensitivity characteristics of the light detection device 1. As is clear from FIG. 10, the sensitivity in the wavelength range of infrared light can be reduced to a value which is close to substantially zero. Hence, with the light detection device 1 according to a preferred embodiment of the present invention, it is possible to accurately calculate illuminations and color temperatures with a small margin of error.

FIG. 11A shows an example of the spectral characteristics (wavelength versus transmittance) of the red filter 16R, FIG. 11B shows an example of the spectral characteristics (wavelength versus transmittance) of the green filter 16G, FIG. 11C shows an example of the spectral characteristics (wavelength versus transmittance) of the blue filter 16B, FIG. 11D shows an example of the spectral characteristics (wavelength versus transmittance) of the clear film 17 and FIG. 11E shows an example of the spectral characteristics (wavelength versus transmittance) of the infrared cut filter 3.

For the infrared light receiving portion 10, as described above, the red filter 16R and the blue filter 16B are arranged so as to be laminated. Hence, as is understood particularly from FIGS. 11A and 11C, light in the wavelength range of approximately 400 to 570 nm is blocked by the red filter 16R, and light in the wavelength range of approximately 550 to 770 nm is blocked by the blue filter 16B. Light in the range of ultraviolet light is blocked both by the red filter 16R and the blue filter 16B. The laminated film of the red filter 16R and the blue filter 16B blocks light of wavelengths in the range of ultraviolet light and in the wavelength range of visible light, and selectively passes light in the wavelength range of infrared light. As is understood from FIG. 11D, the clear film 17 passes light in the wavelength range of infrared light. Hence, the infrared light receiving portion 10 can selectively receive light in the wavelength range of infrared light.

On the other hand, in the infrared cut filter 3, the openings 3A are formed in the regions corresponding to the infrared light receiving portions 10. Hence, light (infrared light) in the wavelength range of infrared light reaches the infrared light receiving portions 10 while being little attenuated. The infrared light receiving portions 10 use, for example, the photodiode Di3 to detect infrared light. Consequently, the infrared light receiving portions 10 are highly sensitive to infrared light due to the openings 3A which are selectively formed in the regions opposite to the infrared light receiving portions 10.

The light detection device 1 can be applied not only to color sensors but also to optical sensors, such as an illumination sensor and a proximity sensor, which have a plurality of optical filters. Furthermore, these optical sensors can be installed in, for example, a smartphone, a mobile phone, a digital camera, a car navigation system, a laptop personal computer and a tablet PC. More specifically, since with the output signals of the red, green and blue light receiving portions 2R, 2G and 2B, it is possible to detect the spectral distribution (color temperatures) of the incident light, it is possible, for example, to appropriately correct an image shot with a camera. The output signal of the infrared light receiving portion 10 is used, and thus it is possible to configure a proximity sensor which can highly accurately detect the proximity of a user, etc.

A form in an application to a smartphone will be specifically described.

Figure 12:
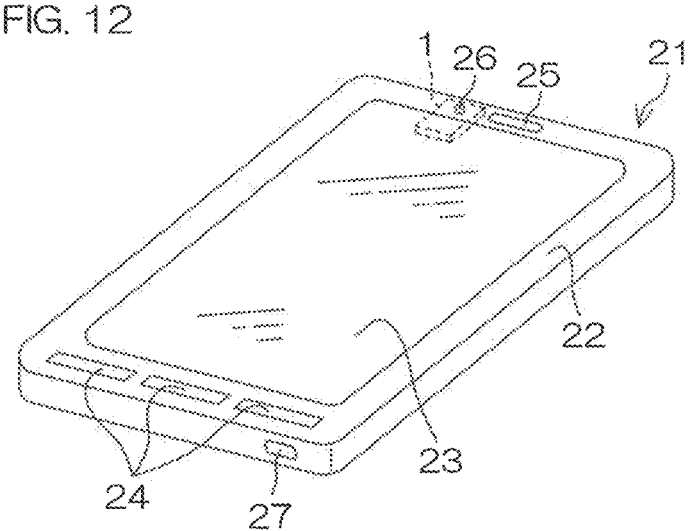
FIG. 12 is a perspective view showing the appearance of a smartphone which is an example of an electronic apparatus using the light detection device.

FIG. 12 is a perspective view showing the appearance of a smartphone 21 which is an example of an electronic apparatus using the light detection device 1.

The smartphone 21 is configured by storing electronic components inside a flat housing 22 in the shape of a rectangular parallelepiped. The housing 22 has, on the front and back sides, a pair of main surfaces in the shape of a rectangle, and the pair of main surfaces are coupled with four side surfaces. The display surface of a display panel 23 formed with a liquid crystal panel, an organic EL panel, etc., is exposed to one main surface of the housing 22. The display surface of the display panel 23 forms a touch panel so as to provide an input interface to a user.

The display panel 23 is formed in the shape of a rectangle which occupies most of the one main surface of the housing 22. Along one short side of the display panel 23, operation buttons 24 are arranged. In the preferred embodiment, a plurality of (three) operation buttons 24 are aligned along the short side of the display panel 23. The user operates the operation buttons 24 and the touch panel to operate the smartphone 21, calls up necessary functions and can perform the necessary functions.

In the vicinity of the other short side of the display panel 23, a speaker 25 is arranged. The speaker 25 provides an earpiece for telephone functions, and may be also used as an acoustic unit for reproducing music data, etc. A lens window 26 is arranged next to the speaker 25. The light detection device 1 is arranged inside the housing 22 so as to be opposite to the lens window 26. On the other hand, near the operation buttons 24, a microphone 27 is arranged in one side surface of the housing 22. The microphone 27 provides a mouthpiece for telephone functions, and is also used as a microphone for recording.

Since the smartphone 21 includes the light detection device 1 which can satisfactorily reduce the sensitivity in the wavelength range of infrared light, even when the transmittance of visible light in the lens window 26 for light reception formed in the smartphone 21 is low, the smartphone 21 can be put to practical use. Thus, it is possible to increase the degree of freedom of the design (such as the change of the color and the shape) of the lens window 26.

Although the preferred embodiment of the present invention is described above, the present invention can be practiced in other forms.

For example, although in the preferred embodiment described above, as a portion of the light detection device 1, the computation portion 4 is provided, the signal separation processing by the computation portion 4 described above may be performed by a logic circuit (such as a CPU in an electronic apparatus) outside the light detection device 1.

Although in the preferred embodiment described above, for the infrared light receiving portion 10, the red filter 16R and the blue filter 16B are arranged so as to be laminated, the red filter 16R and the green filter 16G may be arranged so as to be laminated or the red filter 16R, the green filter 16G and the blue filter 16B may be arranged so as to be laminated. Furthermore, for the infrared light receiving portion 10, a color filter other than the red, green and blue color filters may be arranged. For example, a cyan color filter and a magenta color filter may be arranged so as to be laminated. In other words, preferably, a plurality of color filters which include filters of two colors that selectively pass through light in different wavelength ranges within the wavelength range of visible light are arranged for the infrared light receiving portion 10, and light in the wavelength range of infrared light is made to selectively enter the infrared light receiving portion 10.

The present application corresponds to Japanese Patent Application No. 2016-155772 filed in the Japan Patent Office on Aug. 8, 2016, and the entire disclosure of the application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A light detection device comprising:
   a semiconductor substrate;
   a signal detection light receiving portion that is formed in the semiconductor substrate;
   an infrared light receiving portion that is formed in the semiconductor substrate;
   a first color filter that covers the signal detection light receiving portion and that has a first spectral characteristic such that the first color filter passes therethrough light in a first wavelength range within a wavelength range of visible light and in a wavelength range of infrared light;
   a second color filter that covers the infrared light receiving portion and that has a second spectral characteristic such that the second color filter passes therethrough light in a second wavelength range within the wavelength range of visible light and in the wavelength range of infrared light;
   a third color filter that covers the infrared light receiving portion and that has a third spectral characteristic such that the third color filter passes therethrough light in a third wavelength range different from the second wavelength range within the wavelength range of visible light and in the wavelength range of infrared light; and
   an infrared cut filter that covers the signal detection light receiving portion and that has an opening in a region opposite to the infrared light receiving portion.

2. The light detection device according to claim 1, wherein the first color filter includes a blue filter, a green filter or a red filter,
   the second color filter includes a red filter, and
   the third color filter includes a blue filter or a green filter.

3. The light detection device according to claim 1, further comprising:
   a clear filter that covers the signal detection light receiving portion and the infrared light receiving portion from above the first color filter, the second color filter and the third color filter,
   wherein the infrared cut filter is formed above the clear filter.

4. The light detection device according to claim 3, wherein a transparent protective film is formed on a surface of the clear filter, and the infrared cut filter is formed on the transparent protective film.

5. The light detection device according to claim 1, further comprising:
   a correction light receiving portion that is formed in the semiconductor substrate and that corrects an output signal of the signal detection light receiving portion;
   a fourth color filter that covers the correction light receiving portion and that has a fourth spectral characteristic such that the fourth color filter passes therethrough light in a fourth wavelength range different from the first wavelength range within the wavelength range of visible light and in the wavelength range of infrared light; and a computation portion that is electrically connected to the signal detection light receiving portion and the correction light receiving portion, wherein the first color filter further covers the correction light receiving portion, and the computation portion selectively removes or reduces, based on an output signal of the infrared light receiving portion, a wavelength component of infrared light from the output signal of the signal detection light receiving portion.

6. The light detection device according to claim 5, wherein each of the signal detection light receiving portion and the correction light receiving portion includes a first p-n junction portion that is located at a same depth from a front surface of the semiconductor substrate, and a second p-n junction portion that is located in a position deeper than the first p-n junction portion.

7. The light detection device according to claim 5, wherein the signal detection light receiving portion includes a green signal light receiving portion and a blue signal light receiving portion, the correction light receiving portion includes a green correction light receiving portion and a blue correction light receiving portion, the first color filter includes a green filter that covers the green signal light receiving portion and a blue filter that covers the blue signal light receiving portion and the fourth color filter includes a red filter that covers the green correction light receiving portion and the blue correction light receiving portion and that covers neither the green signal light receiving portion nor the blue signal light receiving portion.

8. The light detection device according to claim 1, wherein the first color filter includes a first color resist, the second color filter includes a second color resist and the third color filter includes a third color resist.

9. An electronic apparatus comprising:

a light detection device; and a housing that stores the light detection device, wherein the light detection device includes:

a semiconductor substrate;

a signal detection light receiving portion that is formed in the semiconductor substrate;

an infrared light receiving portion that is formed in the semiconductor substrate;

a first color filter that covers the signal detection light receiving portion and that has a first spectral characteristic such that the first color filter passes therethrough light in a first wavelength range within a wavelength range of visible light and in a wavelength range of infrared light;

a second color filter that covers the infrared light receiving portion and that has a second spectral characteristic such that the second filter passes therethrough light in a second wavelength range within the wavelength range of visible light and in the wavelength range of infrared light;

a third color filter that covers the infrared light receiving portion and that has a third spectral characteristic such that the third color filter passes therethrough light in a third wavelength range different from the second wavelength range within the wavelength range of visible light and in the wavelength range of infrared light; and an infrared cut filter that covers the signal detection light receiving portion and that has an opening in a region opposite to the infrared light receiving portion.

* * * * *